(12) United States Patent
Hshieh

(10) Patent No.: US 7,687,851 B2
(45) Date of Patent: Mar. 30, 2010

(54) HIGH DENSITY TRENCH MOSFET WITH REDUCED ON-RESISTANCE

(75) Inventor: Fwu-Iuan Hshieh, Saratoga, CA (US)

(73) Assignee: M-MOS Semiconductor Sdn. Bhd. (MY)

( * ) Notice: Subject to any disclaimer, the term of this patent is extended or adjusted under 35 U.S.C. 154(b) by 317 days.

(21) Appl. No.: 11/285,855

(22) Filed: Nov. 23, 2005

(65) Prior Publication Data

US 2007/0114599 A1 May 24, 2007

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/330; 257/331; 257/E29.066
(58) Field of Classification Search ......... 257/327–331, 257/341, E29.066
See application file for complete search history.

(56) References Cited

U.S. PATENT DOCUMENTS

| 7,161,209 | B2 * | 1/2007 | Saito et al. ................... 257/341 |
| 7,285,822 | B2 * | 10/2007 | Bhalla et al. ................. 257/330 |
| 2006/0170037 | A1 * | 8/2006 | Yamauchi et al. ........... 257/330 |

* cited by examiner

*Primary Examiner*—Thien F Tran
(74) *Attorney, Agent, or Firm*—Bo-In Lin

(57) ABSTRACT

A method for manufacturing a trenched metal oxide semiconductor field effect transistor (MOSFET) cell includes the steps of opening a gate trench in a semiconductor substrate and implanting ions of a first conductivity type same as a conductivity type of a source region with at least two levels of implanting energies to form a column of drain-to-source resistance reduction regions below the gate trench. The method further includes steps of forming a gate in the gate trench and forming body and source regions in the substrate surrounding the gate trench. Then the MOSFET cell is covered with an insulation layer and proceeds with applying a contact mask for opening a source-body contact trench with sidewalls substantially perpendicular to a top surface of the insulation layer into the source and body regions. The method further includes a step of implanting ions of a second conductivity type opposite the first conductivity type with at least two levels of implanting energies to form a column of electrical field reduction regions below the source-body contact trench next to the column of drain-to-source resistance reduction regions to function as charge balance regions to the drain-to-source resistance reduction regions.

16 Claims, 12 Drawing Sheets

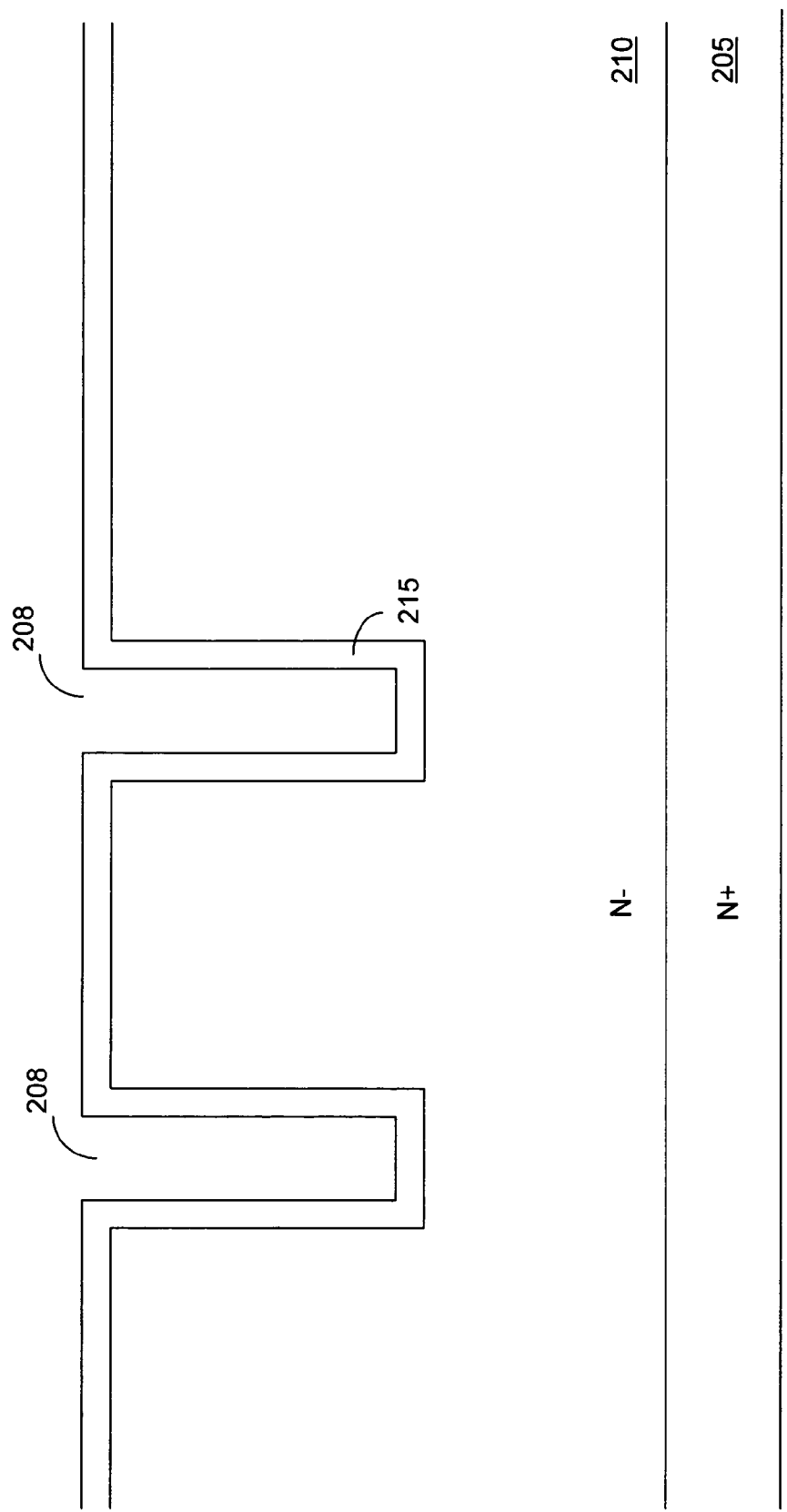

HIGH DENSITY TRENCH MOSFET WITH REDUCED ON-RESISTANCE

BACKGROUND OF THE INVENTION

1. Field of the Invention

This invention relates generally to the cell structure and fabrication process of power semiconductor devices. More particularly, this invention relates to a novel and improved cell structure and improved process for fabricating a trenched semiconductor power device with reduce on-resistance.

2. Description of the Prior Art

Conventional technologies of forming a planar contact to contact both the source and body region present several technical difficulties. First, the planar source contact occupies a large space thus limiting the shrinkage of the cell dimensions. The cell density cannot be further increased due to this limitation. Furthermore, the on-resistance cannot be conveniently reduced due to the fact that for device with break-voltage higher than 30 volts, the resistance is dominated by the resistance in the drift region in the substrate below the trench. The efficiency of such semiconductor devices suffers due to the high on-resistance.

Referring to FIG. 1 for a conventional trenched MOSFET device 10 formed in a semiconductor substrate 15 with a drain region of a first conductivity type, e.g., an N+ substrate, formed at a bottom surface. The trenched MOSFET cell is formed on top of an epitaxial layer 20 of a first conductivity type, e.g., N-epi-layer that having a lower dopant concentration than the substrate. A body region 25 of a second conductivity type, e.g., a P-body region 25, is formed in the epi-layer 20 and the body region 25 encompasses a source region 30 of the first conductivity type, e.g., N+ source region 30. Each MOSFET cell further includes a N+ doped polysilicon gate 35 disposed in a trench insulated from the surrounding epi-layer 20 with a gate oxide layer 40. The MOSFET cell is insulated from the top by an NSG/BPSG layer 45 with a source contact opening to allow a source contact metal layer 50. For the purpose of reducing the ohmic resistance of the source contact 50, a P+ doped region, e.g., a Pwell region 55 is formed below the source contact formed below the source contact 55 between the source regions 30 to improve the electrical contact. The prior art MOSFET cell as shown in FIG. 1 presents at least two problems. One is the planar source-body contact 50 occupies too much space that limits further shrinkage of cell dimension for increasing the cell density. Another problem is the dominance of the resistance Rdrift in the epitaxial layer 20 below the trenched gate 30 for device with breakage voltage higher than 30 volts. The on-resistance cannot be convenient reduced due to this resistance dominance in the drift regions.

Referring to FIG. 2 for a MOSFET device disclosed by Henson in U.S. Pat. No. 6,919,599. The patented invention discloses a short-channel trenched MOS device with reduced gate charges that includes high conductivity regions formed at the bottom of its trenches and field relief regions at or below the bottom of its channel region. The structure of the MOSFET device also includes a planar contact that limits the cell density of the device due to the space occupied by the planar contact. The Rds is reduced by introducing heavier dose near trench bottom without decreasing breakdown voltage by forming additional P region underneath P-body. However, in addition to the extra space occupied by the planar contact as discussed above that limits further shrinkage of the device, such cell configurations have additional drawbacks. Specifically, the energy ion implantation in the formation process of the additional P underneath P-body through the silicon surface affects threshold voltage, and makes channel longer as result of the lateral projection in the ion implantation processes. Furthermore, the benefits of such configuration are significantly decreased when the breakdown voltage is higher than 150 volts since thickness of the epitaxial layer and the resistivity will be increased with the increase of the breakdown voltage and the Rds will be significantly increases accordingly. The heavier N doping regions formed near trench bottom and the P-body are too shallow and would not effective to significantly reduce the Rds that is mainly contributed by the increase of the resistivity caused by a thicker epitaxial layer.

Therefore, there is still a need in the art of the semiconductor device fabrication, particularly for trenched power MOSFET design and fabrication, to provide a novel transistor structure and fabrication process that would resolve these difficulties and design limitations.

SUMMARY OF THE PRESENT INVENTION

Therefore, one aspect of the present invention is to provide new and improved processes to form a trenched MOSFET cell with reduced drain-to-source resistance Rds without degrading the breakdown voltage by forming a super-PN junction structure with alternating P-dopant and N-dopant columns. Doped regions of a first conductivity type are implemented to reduce the Rds resistance while the doped regions formed next to the doped regions of the first conductivity type are implemented to function as electrical field relief and charge balance regions thus remove the potential effects of causing early breakdown thus sustain a high breakdown voltage such that the above-discussed technical difficulties of limited avalanche capability may be resolved.

Specifically, it is an aspect of the present invention to provide a new and improved cell configuration and fabrication process to form a trenched MOSFET cell with reduced source body contact area and also reduced drain-to-source resistance Rds. The source-body contact areas are reduced by forming a source-body contact trench and fill the trench with low resistance source-body contact plug. The drain-to-source resistance is reduced by forming an ion doped region near the bottom of gate trench by implanting through the gate trench thus reduces the epitaxial resistance and that leads to a lower source-to-drain resistance.

Another aspect of the present invention is to form the body and source doped regions below the trench bottom and the body regions by carrying out ion implantations through the gate trenches and the source-body contact trenches. High-energy ion implantation is not necessary thus prevent silicon damages caused by high-energy ion implantations.

Briefly, in a preferred embodiment, the present invention discloses a trenched metal oxide semiconductor field effect transistor (MOSFET) cell that includes a trenched gate surrounded by a source region encompassed in a body region above a drain region disposed on a bottom surface of a substrate. The MOSFET cell further includes a source-body contact trench extended substantially vertical relative to a top surface into the source and body regions and filled with contact metal plug. The trenched MOSFET cell further includes a PN-super junction structure formed underneath the trenched gate and the body region includes alternating column of P-doped and N-doped columns underneath the trenched gate and the source-body contact trench filled with the contact plug. In a preferred embodiment, the MOSFET cell further includes a body-resistance-reduction region doped with a body-resistance-reduction-dopant disposed in the body region immediately near the source-body contact trench. In another preferred embodiment, the alternating column of P-doped and N-doped column further includes alternating columns of body-dopant regions below the source-body contact trench and source-dopant regions below the trenched gate. In another preferred embodiment, the MOSFET cell further includes a body-resistance-reduction region doped with a body-resistance-reduction-dopant disposed in the body region immediately near the source-body contact trench formed by implanting a body-dopant through the source-body contact trench. In another preferred embodiment, the alternating column of P-doped and N-doped column further includes alternating columns of body-dopant regions below the source-body contact trench formed by implanting the body-dopant through the source-body contact trench and source-dopant regions below the trenched gate formed by implanting the source dopant through a gate trench provided to form the trenched gate. In a preferred embodiment, the source-body contact trench is shallower than the body region. In another preferred embodiment, the source-body contact trench is deeper than the body region. In another preferred embodiment, the source-body contact trench is filled with a Ti/TiN/W plug. In a preferred embodiment, the MOSFET cell constituting a N-channel MOSFET cell. In another preferred embodiment, the MOSFET cell constituting a P-channel MOSFET cell.

This invention further discloses a method for manufacturing a double trenched metal oxide semiconductor field effect transistor (MOSFET) cell. The method includes steps of opening a gate trench in a semiconductor substrate and implanting ions of a first conductivity type same as a conductivity type of a source region with at least two levels of implanting energies to form a column of drain-to-source resistance reduction regions below the gate trench. The method further includes a step of opening a source-body contact trench through a insulation layer covering a source region and a body region followed by implanting ions of a second conductivity type opposite the first conductivity type with at least two levels of implanting energies to form a column of electrical field reduction regions below the source-body contact trench next to the column of drain-to-source resistance reduction regions to function as charge balance regions to the drain-to-source resistance reduction regions. In a preferred embodiment, the method further includes a step of forming a contact-resistance-reduction region by implanting ions of the second conductivity type in the body region immediately near the source-body contact trench. In one preferred embodiment, the first conductivity type is a N-type conductivity and the second conductivity type is a P-type conductivity. In another preferred embodiment, the first conductivity type is a P-type conductivity and the second conductivity type is a N-type conductivity. In another preferred embodiment, the method further includes a step of filling the source-body contact trench with a Ti/TiN/W plug as a source-body contact plug. In another preferred embodiment, the step of opening the source-body contact trench includes a step of opening the source-body contact trench shallower than the body region. In a different embodiment, the step of opening the source-body contact trench includes a step of opening the source-body contact trench deeper than the body region These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 5A to 5H are a serial of side cross sectional views for showing the processing steps for fabricating the MOSFET devices as shown in FIGS. 3 and 4.

DETAILED DESCRIPTION OF THE PREFERRED EMBODIMENT

Figure 1:
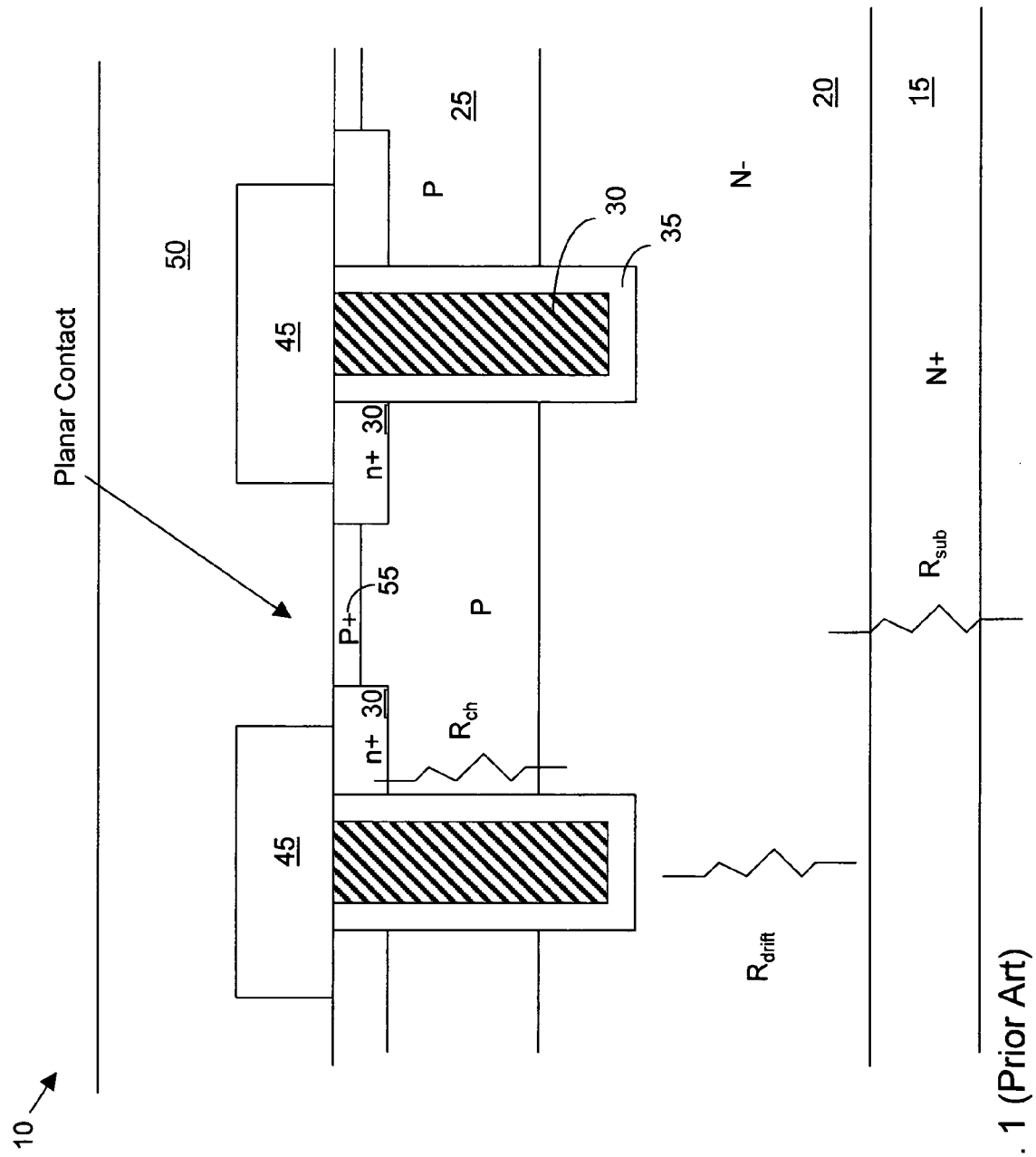
FIG. 1 is a side cross-sectional view of a conventional MOSFET device.
Figure 2:
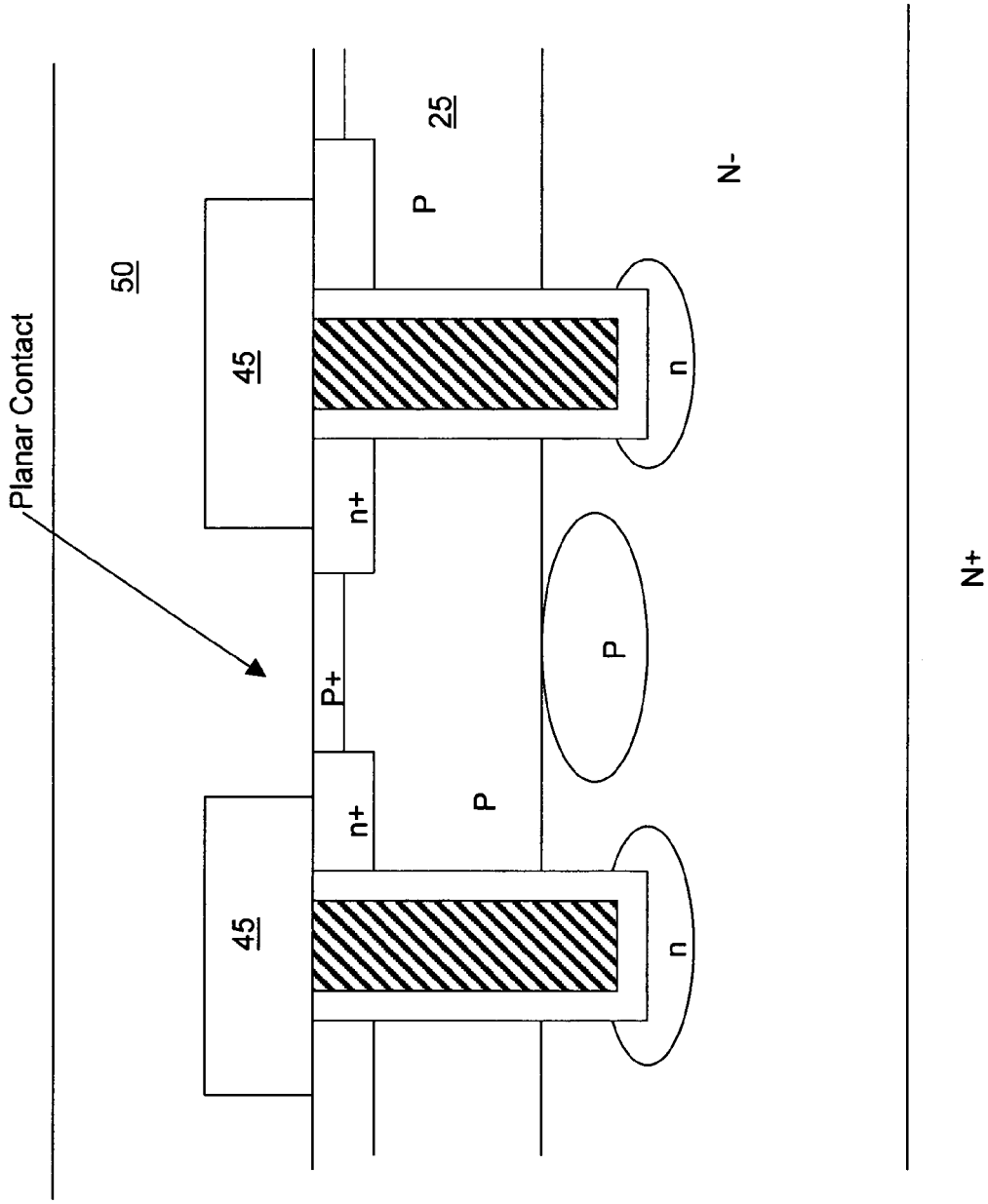
FIG. 2 is a cross sectional view of a short-channel trenched MOS device with reduced gate charges further including high conductivity regions at the bottom of trenches and field relief regions below the bottom of its channel region disclosed by a patented disclosure.
Figure 3:
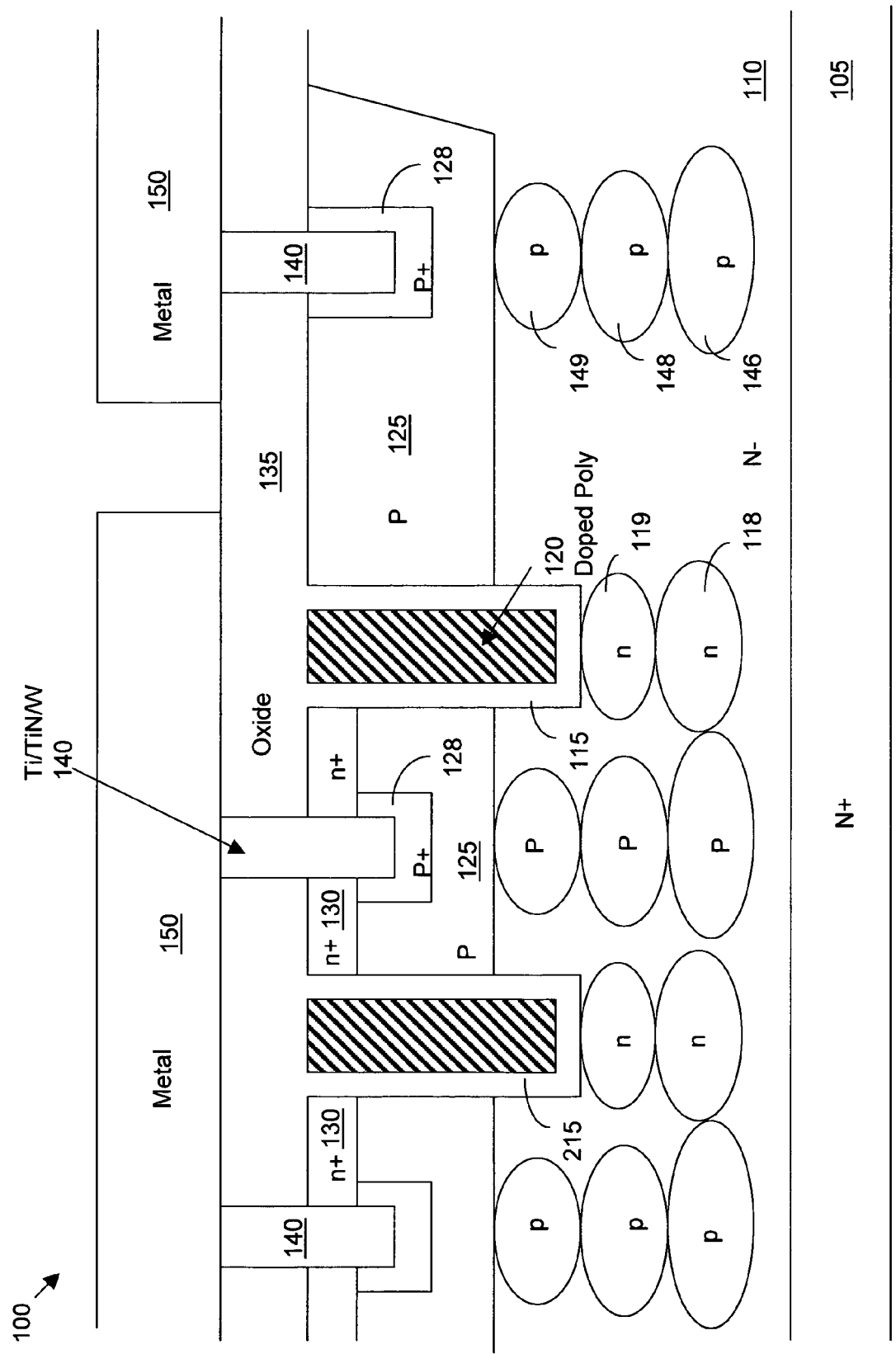
FIG. 3 is a cross sectional view of a MOSFET device of this invention with improved source-plug contacts disposed in source-body contact trenches and PN super-junction structure formed through double trenches with the contact trenches shallower than the P-body.

Please refer to FIG. 3 for a first preferred embodiment of this invention where a metal oxide semiconductor field effect transistor (MOSFET) device 100 is supported on a N+ substrate 105 formed with an N epitaxial layer 110. The MOSFET device 100 includes a trenched gate 120 disposed in a trench with a gate insulation layer 115 formed over the walls of the trench. A body region 125 that is doped with a dopant of second conductivity type, e.g., P-type dopant, extends between the trenched gates 120. The P-body regions 125 encompassing a source region 130 doped with the dopant of first conductivity, e.g., N+ dopant. The source regions 130 are formed near the top surface of the epitaxial layer surrounding the trenched gates 125. The top surface of the semiconductor substrate extending over the top of the trenched gate, the P body regions 125 and the source regions 130 are covered with a NSG-BPSG protective layer 135.

For the purpose of improving the source contact to the source regions 130, a plurality of trenched source contact filled with a tungsten plug surrounded by a barrier layer Ti/TiN 140. The contact trenches are opened through the NSG-BPSG protective layer 135 to contact the source regions 130 and the P-body 125. A top contact layer 150 is then formed on top of the source to contact the trench contact plug 140. The top contact layer 150 is formed with aluminum, aluminum-cooper, AlCuSi, or Ni/Ag, Al/NiAu, AlCu/NiAu or AlCuSi/NiAu as a wire-bonding layer. Optionally, a conductive layer (not shown) sandwiched between the top wire-bonding layer 150 and the top of the trenched source-plug contact is formed to reduce the resistance by providing greater area of electrical contact. With the source-body contact trenches filled with source-body contact plugs as shown in FIG. 3 and FIG. 4 below, the critical dimension can be reduced to a distance smaller than 0.6 micrometers.

For the purpose of reducing the on-resistance without degrading the breakdown voltage, there are PN super-junction structure formed underneath the trenched gate 120 and the body region 125. Specifically, there is a column of N regions 118 and 119 that are formed by N type ion dopant implantations through the trenches before the polysilicon is deposited into the trenched gate and aligned with the gate 120. Furthermore, there is a column of P regions 146, 148, and 149 below the body regions formed by P-type ion implantations through the source-body contact trenches before the source-body contact plugs 140 are filled into the source-body contact trenches and are aligned with the source-body contact trenches. These columns of N regions and P-regions are formed to reduce the drain to source resistance Rds without degrading the breakdown voltage and channel length. Specifically, the N column that includes N regions 118 and 119 are formed to reduce the Rds because the N column that includes N-doped regions 118 and 119 has heavier doping concentration than the doping concentration of the epitaxial layer 110. In order to further reduce the drain to source resistance, the source-body contact plugs 140 filled in the source-body contact trenches are surrounded by a P+ doped regions. Additionally, the P column that includes P regions 146, 148 and 149 as shown are formed as field relief regions for sustaining high breakdown voltage and channel length. The electrical field near by the N column regions 118 and 119 will become stronger than conventional configuration thus the N-column regions will lead to a degraded early breakdown. In order prevent the early breakdown and to sustain a high breakdown voltage, the P column regions 146, 148 and 149 are formed as electrical relief regions or as the charge balance regions with approximate equal dose to the N column regions 118 and 119. The P column regions thus provide the function of balancing the increase of the electrical field resulted from the N column regions 118 and 119 to prevent the occurrence of early breakdown. According the configuration as shown in FIG. 3, the trenched MOSFET 100 includes a plurality of source dopant regions 118 and 119 vertically implanted and aligned with the trenched gate 120 extending over a first vertical length, i.e., a vertical length of regions 118 and 119, in an epitaxial layer 110 supported on a substrate 105 and a plurality of body dopant regions 146, 148 and 149, vertically implanted and aligned with the source-body contact trench 140 extending over a second vertical length, i.e., the total vertical length of regions 146, 146, and 149, that is different from the first vertical length of the total vertical length of regions 118 and 119 in the epitaxial layer 110. The vertical lengths of the regions 118 and 119 and the vertical length of the regions 146, 148 and 149 depend on a trench depth of the trenched gate 120 versus a trench depth of said source-body contact trench 140.

The boron Ion Implantation energy required to form same depth of the P column underneath the P body as disclosed is lower than the conventional technology because the P-ions are implanted in this invention is implanted through the trenches. In contrast, the ions are implanted through a planar contact in the conventional device. Unlike the conventional devices, the P column regions have less lateral projection range during a boron ion implantation. The problems of conventional technology of lateral projection of implanted ions to reach the channel region and increasing the channel length are therefore resolved by the ion implant process of this invention by implanting the ions through the trenches instead of through the planar contacts.

Figure 4:
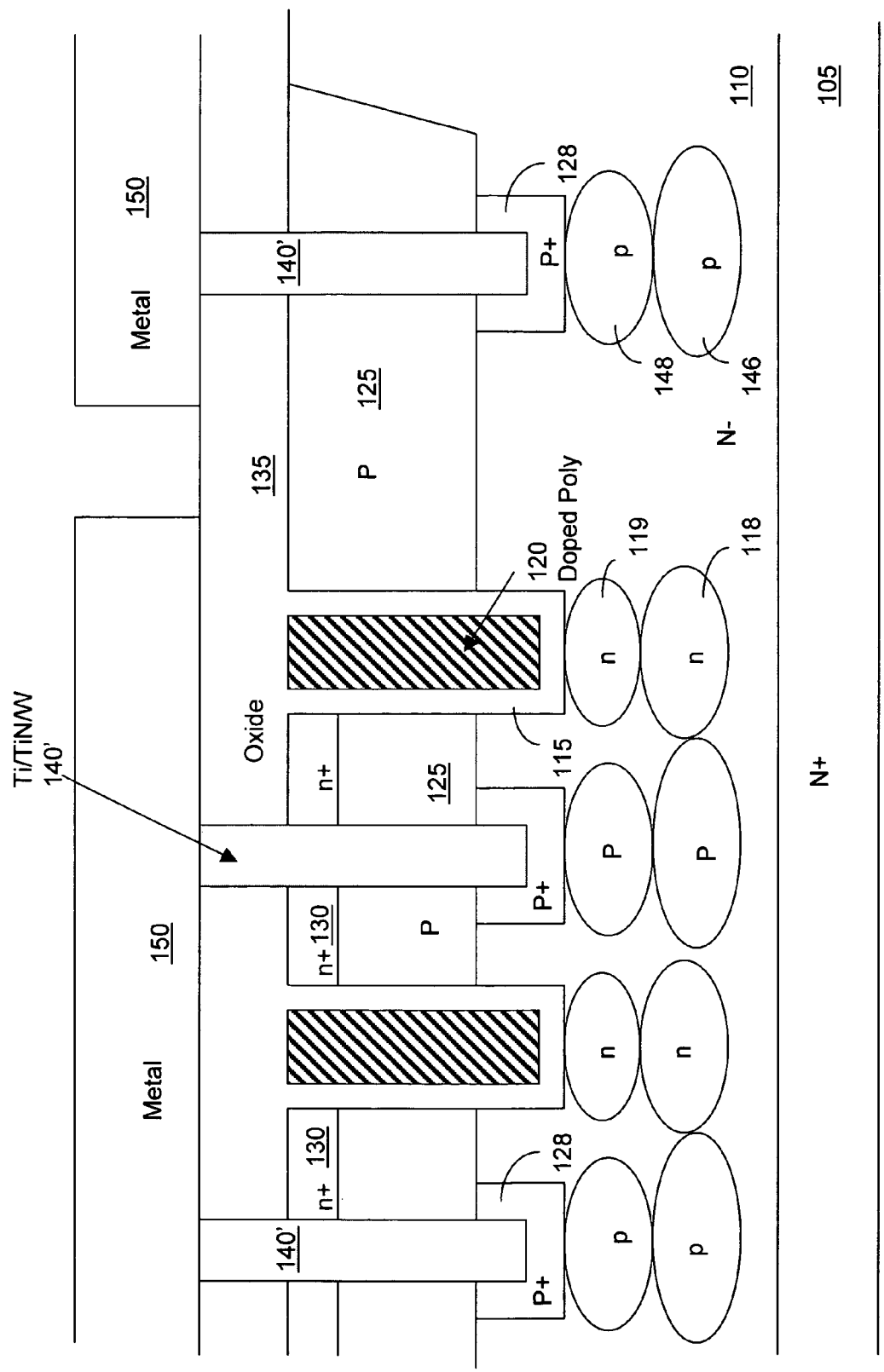
FIG. 4 is a cross sectional view of another MOSFET device of this invention with improved source-plug contacts disposed in source-body contact trenches and PN super-junction structure formed through double trenches with the contact trenches deeper than the P-body.

Referring to FIG. 4 that for another preferred embodiment of this invention of a MOSFET that has a basically identical cell structure as the device shown in FIG. 3. The only difference is the source-body contact trench that filled with the source-body contact plug of Ti/TiN/W 140' has a greater depth that extends into the epitaxial layer 110 below the body region 125. Advantage of this embodiment is to further reduce the boron ion implantation energy to reduce the effects that the ion implantation may have on the channel length due to the lateral projection range of ions that could potentially reach the channel regions. By reducing the energy of ion implantation, the lateral projection range of the implanted ions is also reduced as shown in the oval shape thus minimizing the effects the ion implantation may have on the channel length.

Therefore, this invention discloses a double-trenched metal oxide semiconductor field effect transistor (MOSFET) cell that includes a trenched gate and a trenched source-body contact plug. The MOSFET cell further includes a PN-super junction structure formed underneath the trenched gate and a body region surrounding the trenched gate wherein the PN-super junction structure further includes alternating columns of P-doped and N-doped columns underneath the trenched gate and the trenched source-body contact plug. In a preferred embodiment, the double trenched MOSFET cell further includes a body-resistance-reduction region doped with a body-resistance-reduction-dopant disposed in the body region immediately near the trenched source-body contact plug. In another preferred embodiment, the alternating columns of P-doped and N-doped columns further include alternating columns of body-dopant regions below the trenched source-body contact plug and source-dopant regions below the trenched gate. In another preferred embodiment, the trenched source-body contact plug is shallower than a body region of the double-trenched MOSFET cell. In another preferred embodiment, the trenched source-body contact plug is deeper than a body region of the double-trenched MOSFET cell. In another preferred embodiment, the trenched source-body contact plug further includes a Ti/TiN/W plug. In another preferred embodiment, the double-trenched MOSFET cell constituting a N-channel MOSFET cell. In another preferred embodiment, the double-trenched MOSFET cell constituting a P-channel MOSFET cell.

Figure 5B:
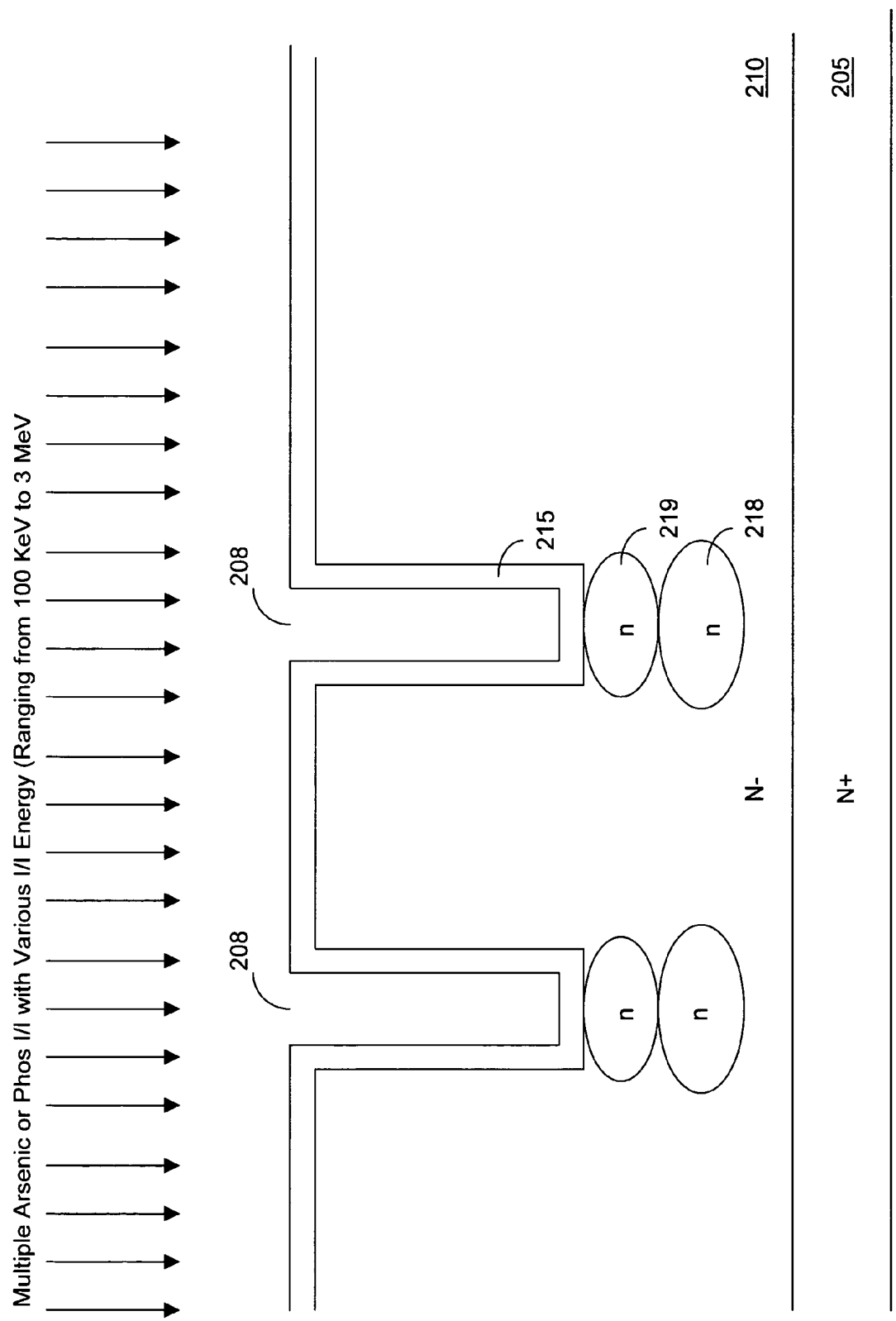
Figure 5C:
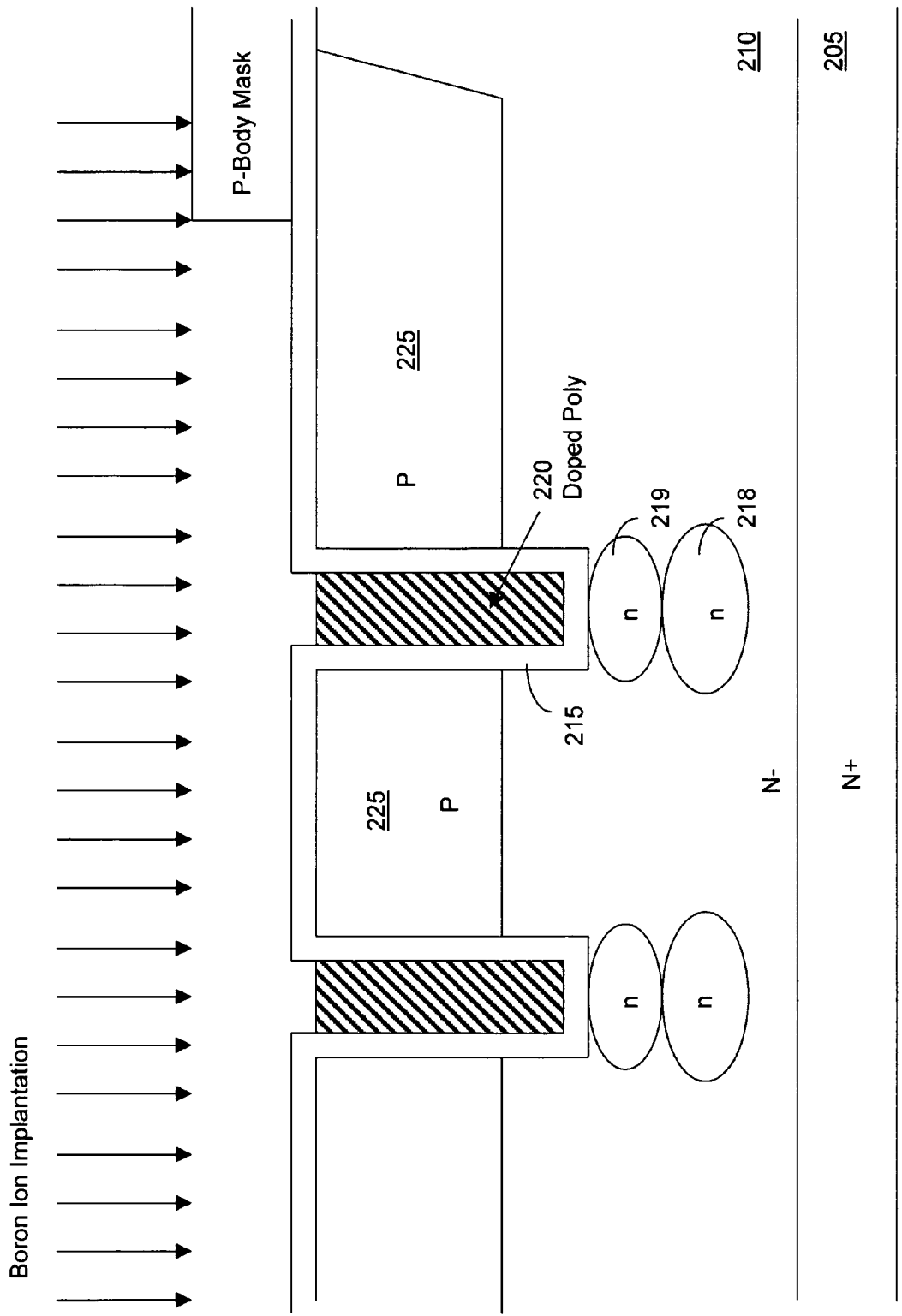
Figure 5D:
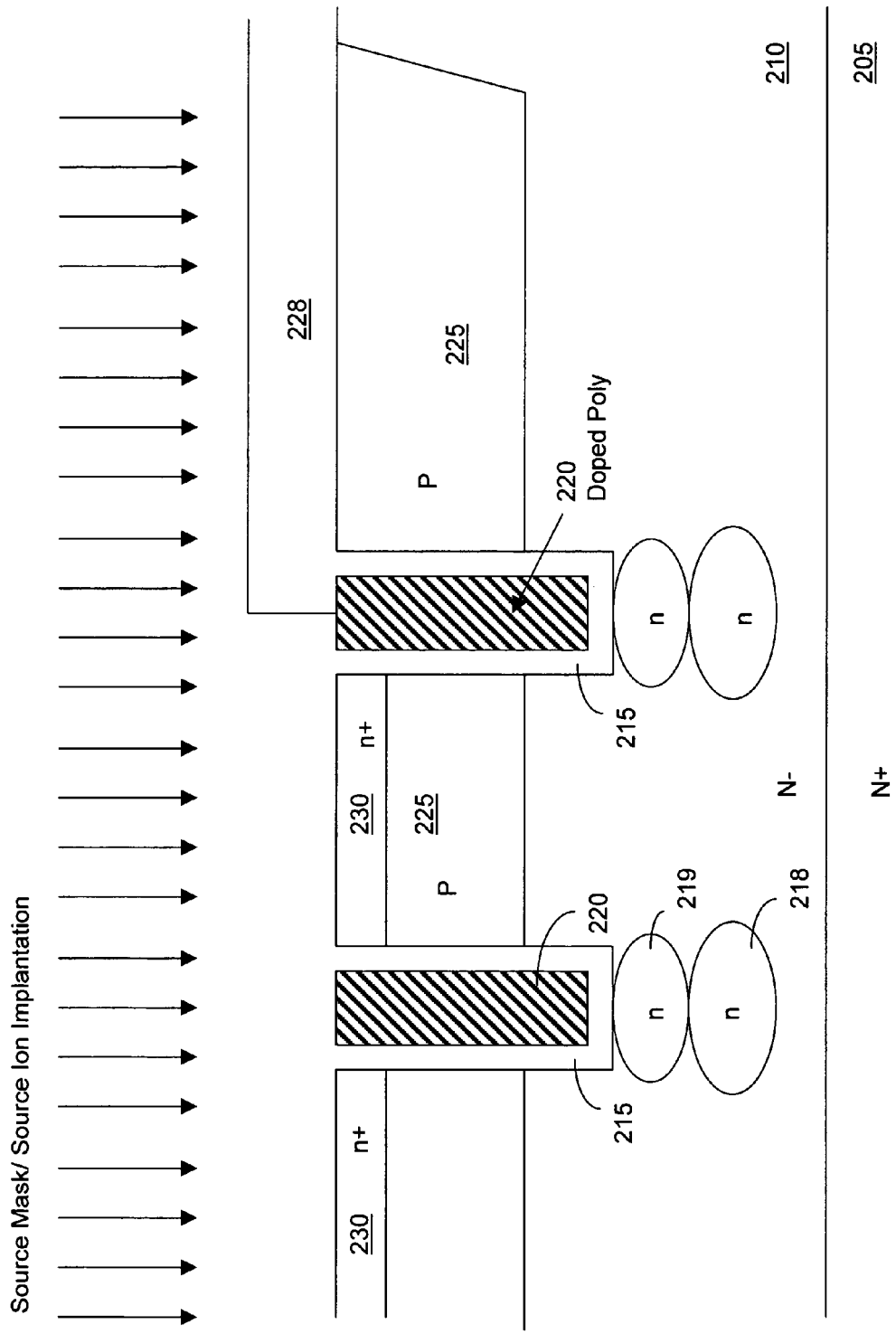
Figure 5E:
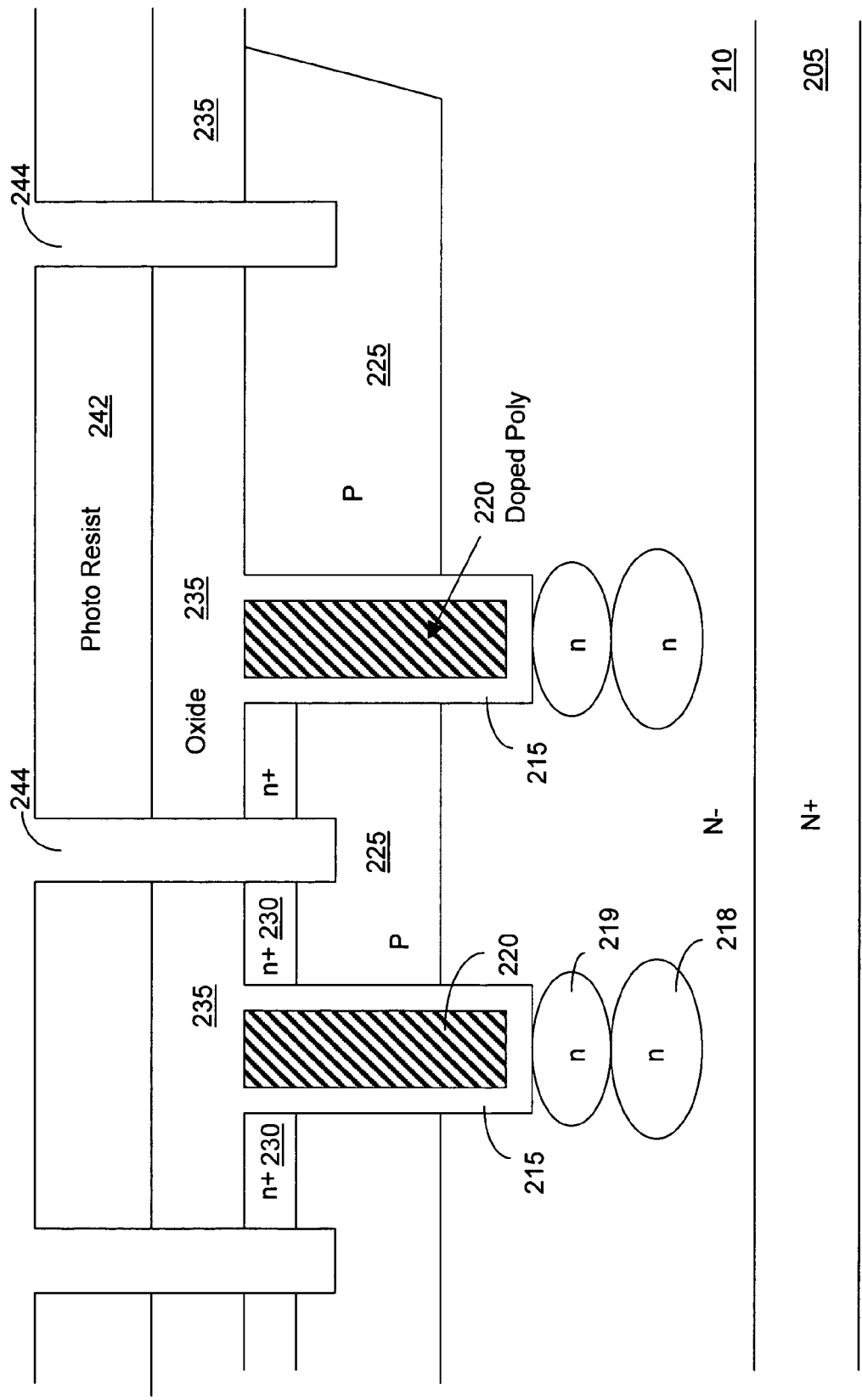

Referring to FIGS. 5A to 5H for a serial of side cross sectional views to illustrate the fabrication steps of a MOSFET device as that shown in FIGS. 3 and 4. In FIG. 5A, a photoresist (not shown) is applied to open a plurality of trenches 208 in an epitaxial layer 210 supported on a substrate 205. Then, an oxidation process is performed to form an oxide layer 215 covering the trench walls. The trench is oxidized with a sacrificial oxide to remove the plasma damaged silicon layer during the process of opening the trench. In FIG. 5B, multiple arsenic or phosphorous ions with energy ranging from 100 Kev to 3 Mev are implanted through the trenches 208 to form a plurality of N regions 218 and 219 below the trenches 208. In FIG. 5C, a polysilicon layer 220 is deposited to fill the trench and covering the top surface and then doped with an N+ dopant. The polysilicon layer 220 is etched back followed by a applying a P-body mask for carrying out a P-body implant with a P-type dopant. Then an elevated temperature is applied to diffuse the P-body 225 into the epitaxial layer 210. In FIG. 5D, a source mask 228 is applied followed by an source implant with a N-type dopant. Then an elevated temperature is applied to diffusion the source regions 230. In FIG. 5E, an oxide layer 235 is deposited on the top surface. Then, a contact mask 242 is applied to carry out a contact etch to open the contact opening 244 by applying an oxide etch through the oxide layer followed by a silicon etch to open the contact openings 244 further deeper into the source regions 230 and the body regions 225. The MOSFET device thus includes a source-body contact trench 244 that has an oxide trench formed by first applying an oxide-etch through the oxide layer 235. The source-body contact trench 244 further includes a silicon trench formed by applying a silicon-etch following the oxide-etch. The oxide etch and silicon etch may be a dry oxide and silicon etch whereby a critical dimension (CD) of the source-body contact trench is better controlled. For the purpose of opening the source-body-contact trenches 244, different etching processes are available. The various slope and vertical contact trench profiles for the contact trenches 244 are achieved by using different gas ratios of C4F8 (or C3F6)/CO/O2/Ar plasma for dry oxide etch and CF4 (or HBr)/O2/Cl2 plasma for dry silicon etch.

Figure 5F:
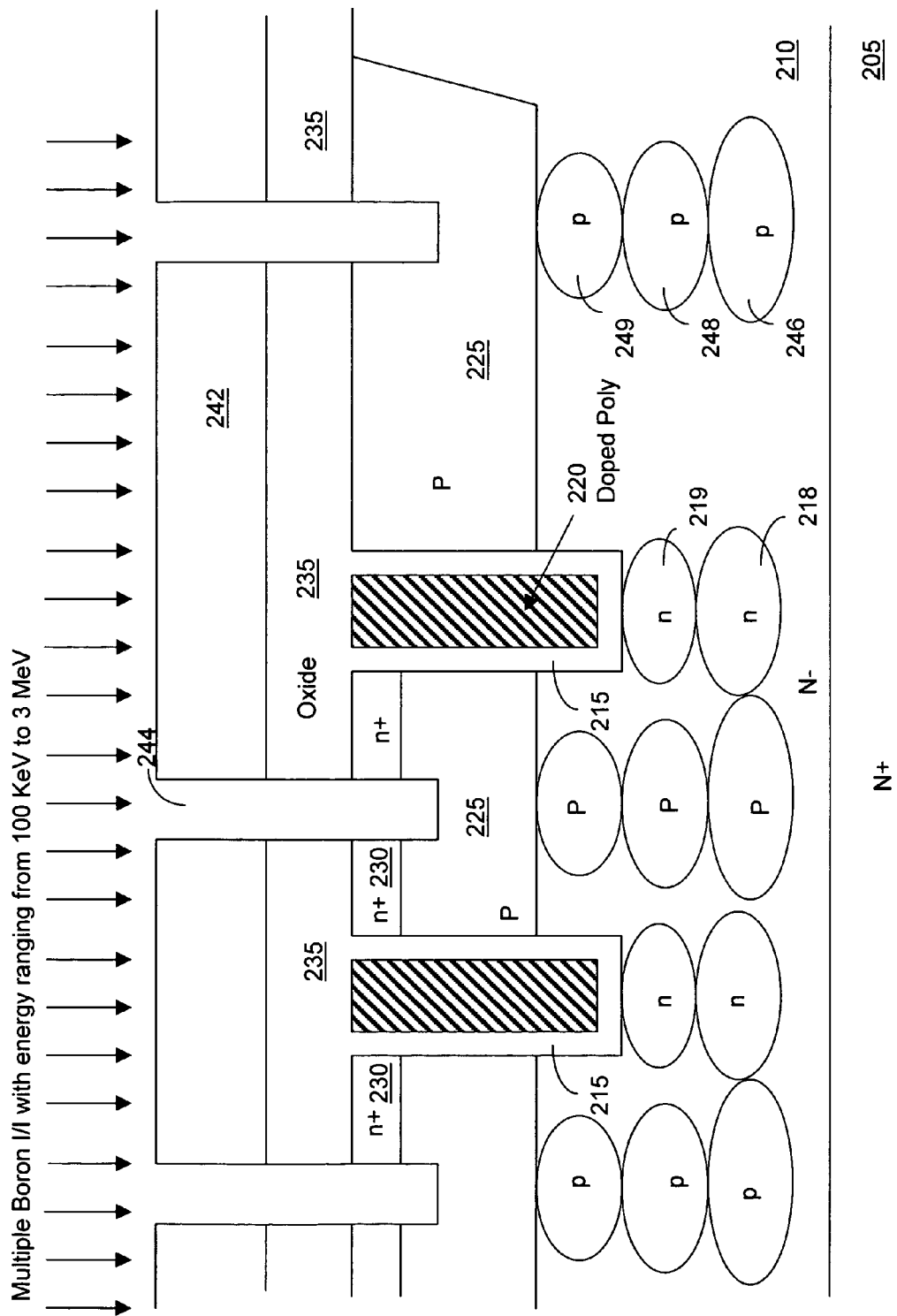
Figure 5G:
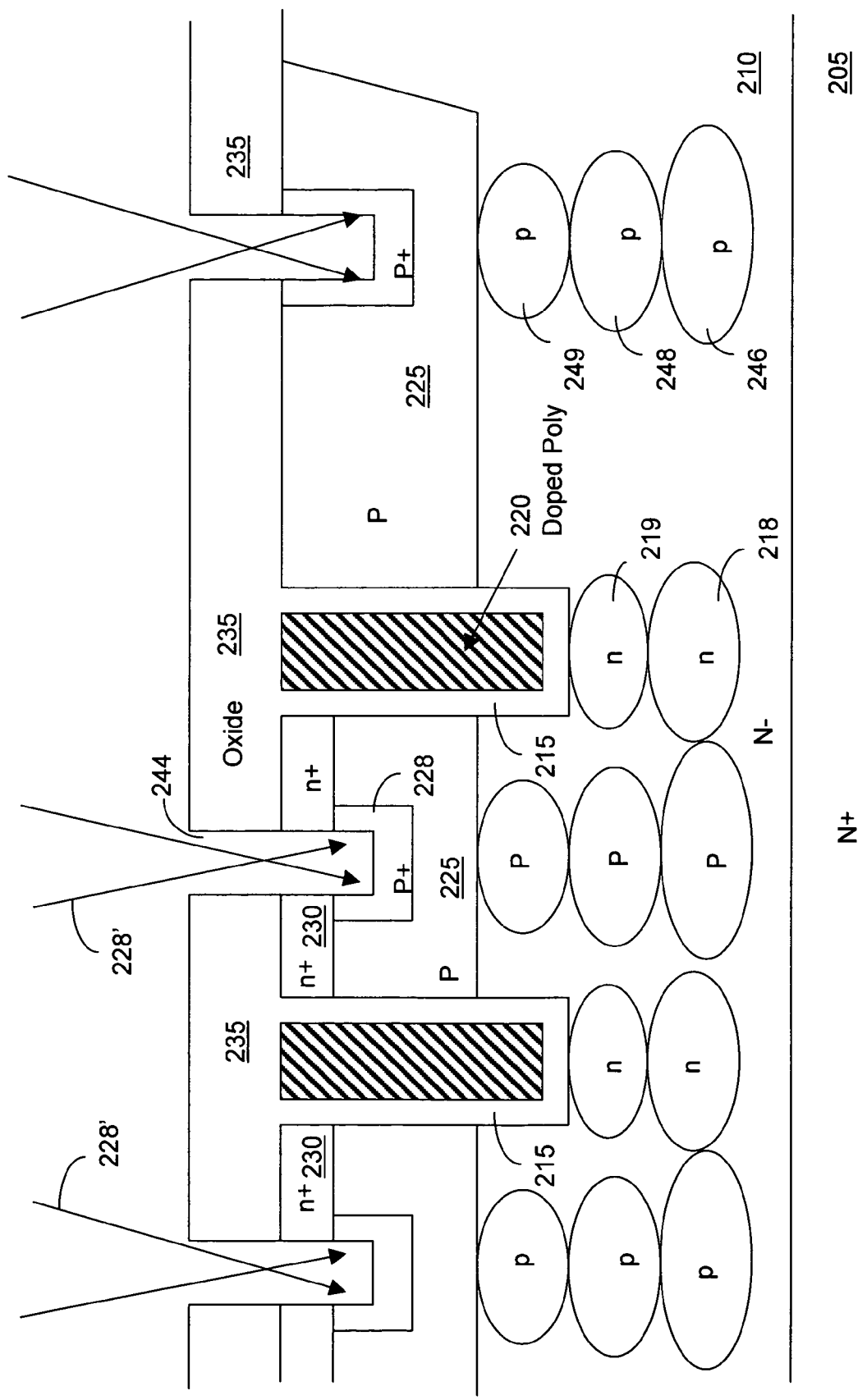
Figure 5H:
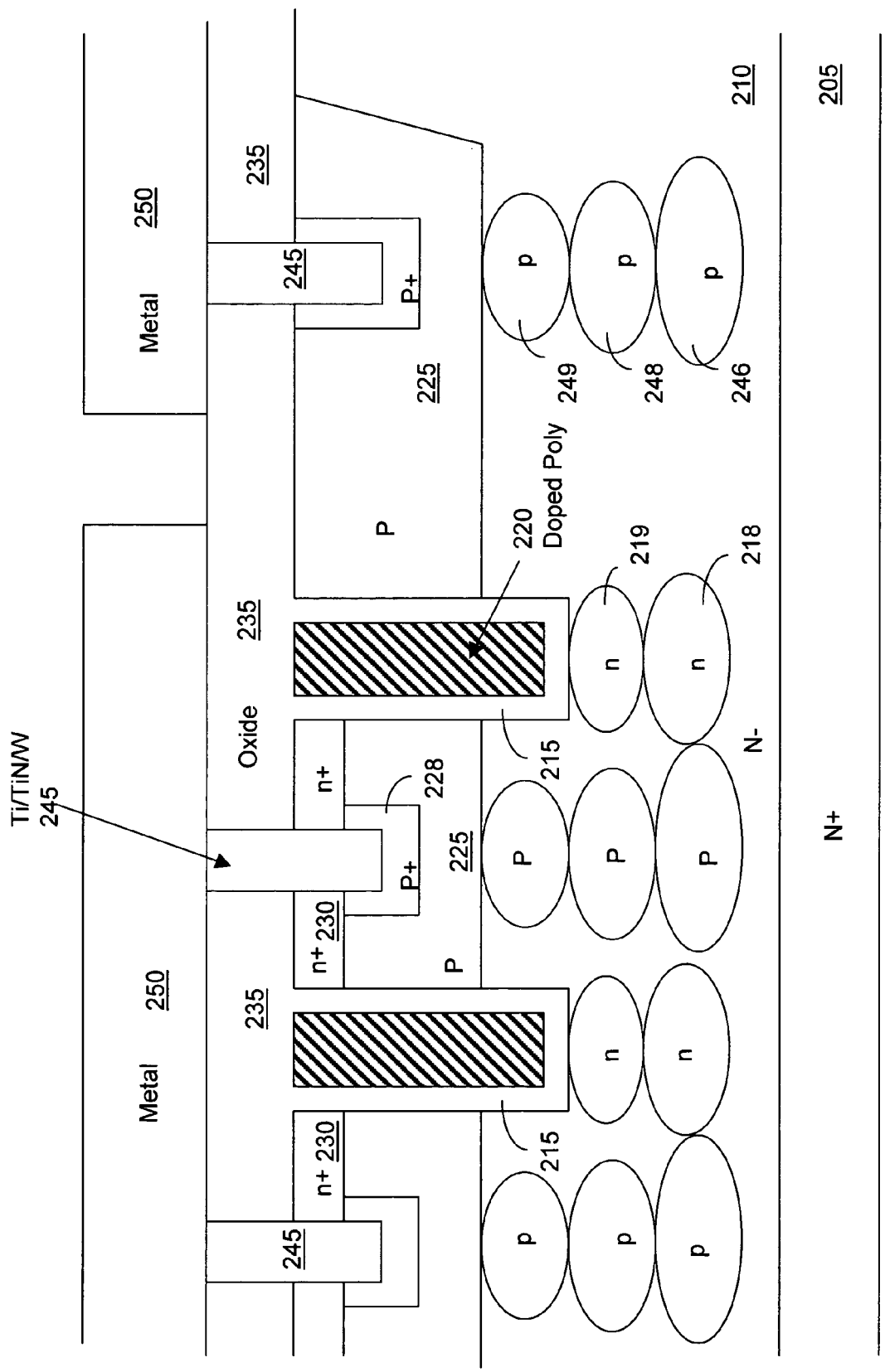

In FIG. 5F, multiple ion beams of different energies ranging from 100 Kev to 3 Mev are implanted through the contact trenches 244 to form buried P-regions 246, 248 and 249 below the P-body region in the epitaxial layer 210. In FIG. 5G, the contact trench mask 242 is removed followed by an angular boron or BF2 implant with P+ ions 228' is first performed to form the P+ doped region 228 to surround the contact trenches 224. The implantation is carried out along a tilted angular direction of few degrees relative to a perpendicular direction relative to the substrate top surface because the sloped sidewalls of the contact trenches 244. In FIG. 5H, a Ti/TiN layer 245 is deposited onto the top layer followed by forming a tungsten layer on the top surface that fill in the contact opening to function as a source and body contact plug. A tungsten etch is carried out to etch back the tungsten layer. A low resistance metal layer 250 is deposited over the top surface. The low resistance metal layer may be composed of Ti or Ti/TiN to assure good electric contact is established and followed by a metal patterning process to form the metal contact for the device. Silicon damage is reduced compared to the conventional techniques of implanting through the planar contact. The ion implantation energy through contact trench as disclosed in this invention is about 200 KeV~500 KeV that is significantly lower than the ion implantation energy through the planar contact of the prior art for same P column depth for the contact trench depth ranging from 0.5 um to 1.0 um. Thermal anneal at temperature ranging from 900° C. to 1000° C. are followed to anneal out ion implantation damage.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A trenched metal oxide semiconductor field effect transistor (MOSFET) cell comprising a trenched gate surrounded by a source region encompassed in a body region above a drain region disposed on a bottom surface of a substrate, wherein said MOSFET cell further comprising:
a source-body contact trench extended substantially vertical relative to a top surface into said source and body regions and filled with contact metal plug; and
a plurality of source dopant regions vertically implanted and aligned with said trenched gate and a plurality of body dopant regions vertically implanted and aligned with said source-body contact trench wherein at least one set of said plurality of source dopant regions aligned with said trenched gate extended over a first vertical length different from a second vertical length of said body dopant regions aligned with said source-body contact trench extended in an epitaxial layer supported on said substrate wherein said first vertical length and second vertical length depending on a trench depth of said trenched gate versus a trench depth of said source-body contact trench.

2. The MOSFET cell of claim 1 further comprising:
a body-resistance-reduction region doped with a body-resistance-reduction-dopant disposed in said body region implanted through and immediately below said source-body contact trench.

3. The MOSFET cell of claim 1 wherein:
said plurality of source dopant regions vertically implanted and aligned with said trenched gate vertically extends in said epitaxial layer to a depth near a bottom of said epitaxial layer substantially the same as said plurality of body dopant regions vertically implanted and aligned with said source-body contact trench.

4. The MOSFET cell of claim 1 wherein:
said plurality of source dopant regions vertically implanted and aligned with said trenched gate are formed in said epitaxial layer at a lateral distance away from said plurality of body dopant regions vertically implanted and aligned with said source-body contact trench.

5. The MOSFET cell of claim 1 wherein:
said plurality of source dopant regions vertically implanted and aligned with said trenched gate are formed and extended in said epitaxial layer over said first vertical length shorter than said second vertical length of said plurality of body dopant regions vertically implanted and aligned with said source-body contact trench extending in said epitaxial layer.

6. The MOSFET cell of claim 1 wherein:
said source-body contact trench is shallower than said body region.

7. The MOSFET cell of claim 1 wherein:
said source-body contact trench is filled with a Ti/TiN/W plug.

8. The MOSFET cell of claim 1 wherein:
said MOSFET cell constituting a N-channel MOSFET cell.

9. A double-trenched metal oxide semiconductor field effect transistor (MOSFET) cell comprising a trenched gate and a source-body contact trench filled with a source-body contact plug, wherein said MOSFET cell further comprising:
a plurality of source dopant regions vertically implanted and aligned with said trenched gate extending over a first vertical length in an epitaxial layer supported on a substrate and a plurality of body dopant regions vertically implanted and aligned with said source-body contact trench extending over a second vertical length different from said first vertical length in said epitaxial layer depending on a trench depth of said trenched gate versus a trench depth of said source-body contact trench.

10. The double-trenched MOSEET cell of claim 9 further comprising:
a body-resistance-reduction region doped with a body-resistance-reduction-dopant disposed in a body region implanted through and immediately below said source-body contact trench.

11. The double-trenched MOSFET cell of claim 9 wherein:
said plurality of source dopant regions vertically implanted and aligned with said trenched gate vertically extends in said epitaxial layer to a depth near a bottom of said epitaxial layer substantially the same as said plurality of body dopant regions vertically implanted and aligned with said source-body contact trench.

12. The double-trenched MOSFET cell of claim 9 wherein:
said plurality of source dopant regions vertically implanted and aligned with said trenched gate are formed in said epitaxial layer at a lateral distance away from said plurality of body dopant regions vertically implanted and aligned with said source-body contact trench.

13. The double-trenched MOSEET cell of claim 9 wherein:
said plurality of source dopant regions vertically implanted and aligned with said trenched gate are formed and extended in said epitaxial layer over said first vertical length shorter than said second vertical length of said plurality of body dopant regions vertically implanted and aligned with said source-body contact trench extending in said epitaxial layer.

14. The double-trenched MOSFET cell of claim 9 wherein:
said source-body contact trench is shallower than a body region of said double-trenched MOSFET cell.

15. The double-trenched MOSFET cell of claim 9 wherein:
said source-body contact trench is filled with said source-body contact plug comprising a Ti/TiN/W plug.

16. The double-trenched MOSFET cell of claim 9 wherein:
said double-trenched MOSFET cell constituting a N-channel MOSFET cell.

* * * * *